(12) United States Patent
Kanesada

(10) Patent No.: US 9,608,031 B2
(45) Date of Patent: Mar. 28, 2017

(54) METHOD FOR MANUFACTURING SOLID-STATE IMAGE SENSOR

(71) Applicant: CANON KABUSHIKI KAISHA, Tokyo (JP)

(72) Inventor: Takayasu Kanesada, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/055,949

(22) Filed: Feb. 29, 2016

(65) Prior Publication Data

US 2016/0268332 A1    Sep. 15, 2016

(30) Foreign Application Priority Data

Mar. 13, 2015   (JP) ................................. 2015-051293

(51) Int. Cl.
*H01L 27/146* (2006.01)

(52) U.S. Cl.
CPC .... *H01L 27/14685* (2013.01); *H01L 27/1462* (2013.01); *H01L 27/14629* (2013.01); *H01L 27/14621* (2013.01); *H01L 27/14627* (2013.01)

(58) Field of Classification Search
CPC ......... H01L 27/14627; H01L 27/14685; H01L 27/1462
See application file for complete search history.

(56) References Cited

U.S. PATENT DOCUMENTS

| 7,196,365 | B2 | 3/2007 | Yamamura |
| 7,655,495 | B2 | 2/2010 | Adkisson et al. |
| 7,759,712 | B2 | 7/2010 | Yamamura |
| 8,211,740 | B2 | 7/2012 | Yamamura |
| 8,300,128 | B2 | 10/2012 | Toumiya |
| 2006/0208289 | A1* | 9/2006 | Ohkawa ............ H01L 21/76897 257/291 |
| 2009/0278967 | A1* | 11/2009 | Toumiya ........... H01L 27/14625 348/294 |
| 2012/0038015 | A1* | 2/2012 | Huang .............. H01L 27/14625 257/437 |
| 2012/0280348 | A1* | 11/2012 | Chou ................ H01L 27/14623 257/435 |
| 2014/0375853 | A1 | 12/2014 | Tsukagoshi et al. |

FOREIGN PATENT DOCUMENTS

| JP | 2003-324189 A | 11/2003 |
| JP | 2008-522408 A | 6/2008 |
| JP | 2008-192951 A | 8/2008 |
| JP | 2009-272568 A | 11/2009 |
| JP | 2015-005578 A | 1/2015 |
| WO | 2006/060212 A1 | 6/2006 |

* cited by examiner

*Primary Examiner* — Amar Movva
(74) *Attorney, Agent, or Firm* — Fitzpatrick, Cella, Harper & Scinto

(57) ABSTRACT

A method for manufacturing a solid-state image sensor, the method comprising preparing a substrate including a photoelectric conversion portion, forming, on the substrate, a structure which includes a first member made of a material containing silicon oxide and a second member arranged on the first member and made of a material containing silicon carbide, forming an opening in a position above the photoelectric conversion portion in the structure by removing a part of the first and the second members, and forming a transparent member in the opening, wherein the second member is formed at a first temperature and the transparent member is formed at a second temperature lower than the first temperature.

10 Claims, 5 Drawing Sheets

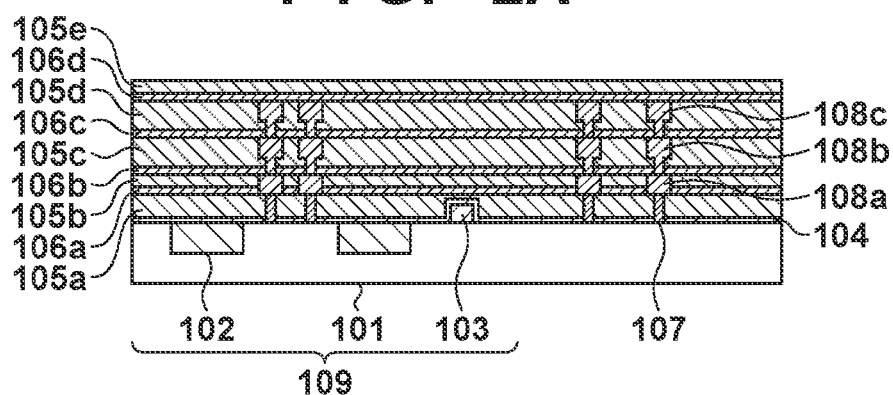
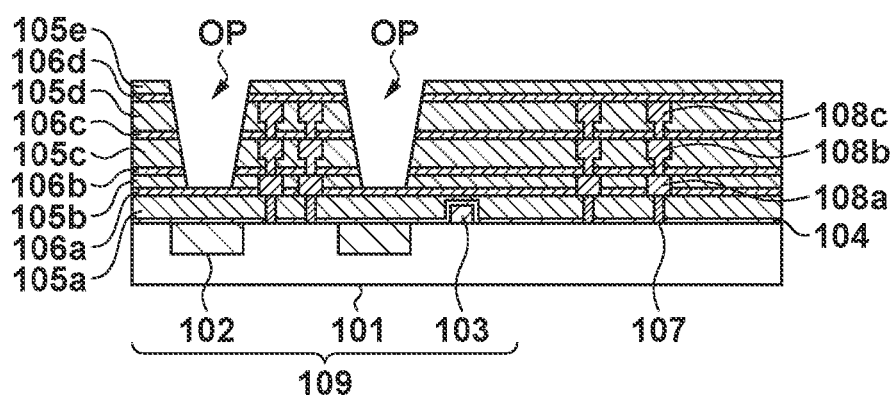
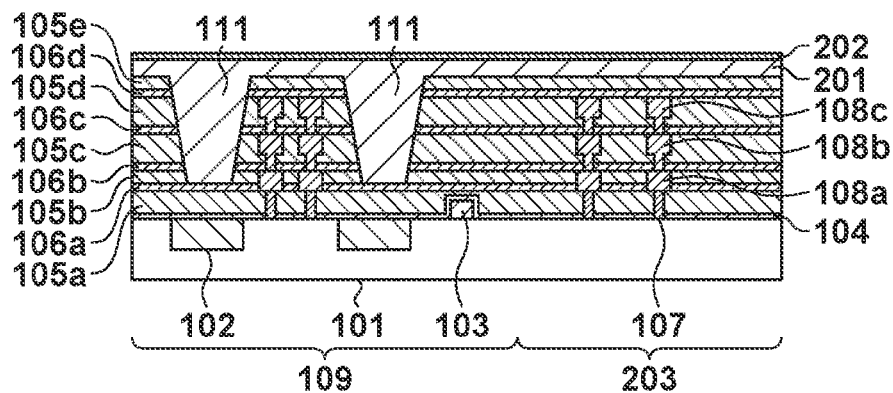

METHOD FOR MANUFACTURING
SOLID-STATE IMAGE SENSOR

BACKGROUND OF THE INVENTION

Field of the Invention

The present invention relates to a method for manufacturing a solid-state image sensor.

Description of the Related Art

A solid-state image sensor includes, for example, a semiconductor substrate which includes a photoelectric conversion portion, and a structure arranged on the semiconductor substrate and including an insulating member and a metal interconnection arranged in the insulating member. The insulating member is generally made of a plurality of layers where interlayer insulating layers and anti-diffusion layers for preventing diffusion of a metal from the metal interconnection are formed alternately. Silicon oxide is typically used for the interlayer insulating layers. Silicon nitride or the like can be used for the anti-diffusion layers. It is more preferable, however, that silicon carbide smaller than silicon nitride in a relative dielectric constant is used.

Some solid-state image sensors further include light-guide portions formed in positions above photoelectric conversion portions. Each light-guide portion guides light which has passed through an optical element such as a microlens to the photoelectric conversion portion. Each light-guide portion is obtained by, for example, forming an opening in the above-described insulating member, and then forming a transparent member made of silicon nitride or the like in this opening. The transparent member is formed at a relatively high temperature by a deposition method such as plasma CVD.

When forming each light-guide portion, a temperature change may cause a stress between the respective layers of the insulating member. In particular, some layers may be separated because a difference in a thermal expansion coefficient is large between silicon oxide of the interlayer insulating layers and silicon carbide of the anti-diffusion layers. This causes a reduction in quality of the solid-state image sensor.

SUMMARY OF THE INVENTION

The present invention provides a technique advantageous in improving quality of a solid-state image sensor.

One of the aspects of the present invention provides a method for manufacturing a solid-state image sensor, the method comprising preparing a semiconductor substrate including a photoelectric conversion portion, forming, on the semiconductor substrate, a structure which includes a first member, which has insulating property, made of a material containing silicon oxide, and a second member, which has insulating property, arranged on the first member and made of a material containing silicon carbide, forming an opening in a position above the photoelectric conversion portion in the structure by removing a part of the first member and a part of the second member, and forming a third member, which has transparent property, in the opening, wherein the second member is formed at a first temperature in the forming the structure and the third member is formed at a second temperature lower than the first temperature in the forming the third member.

Further features of the present invention will become apparent from the following description of exemplary embodiments with reference to the attached drawings.

BRIEF DESCRIPTION OF THE DRAWINGS

FIGS. 2A to 2E are views for explaining an example of a method for manufacturing the solid-state image sensor;

DESCRIPTION OF THE EMBODIMENTS

Figure 1:
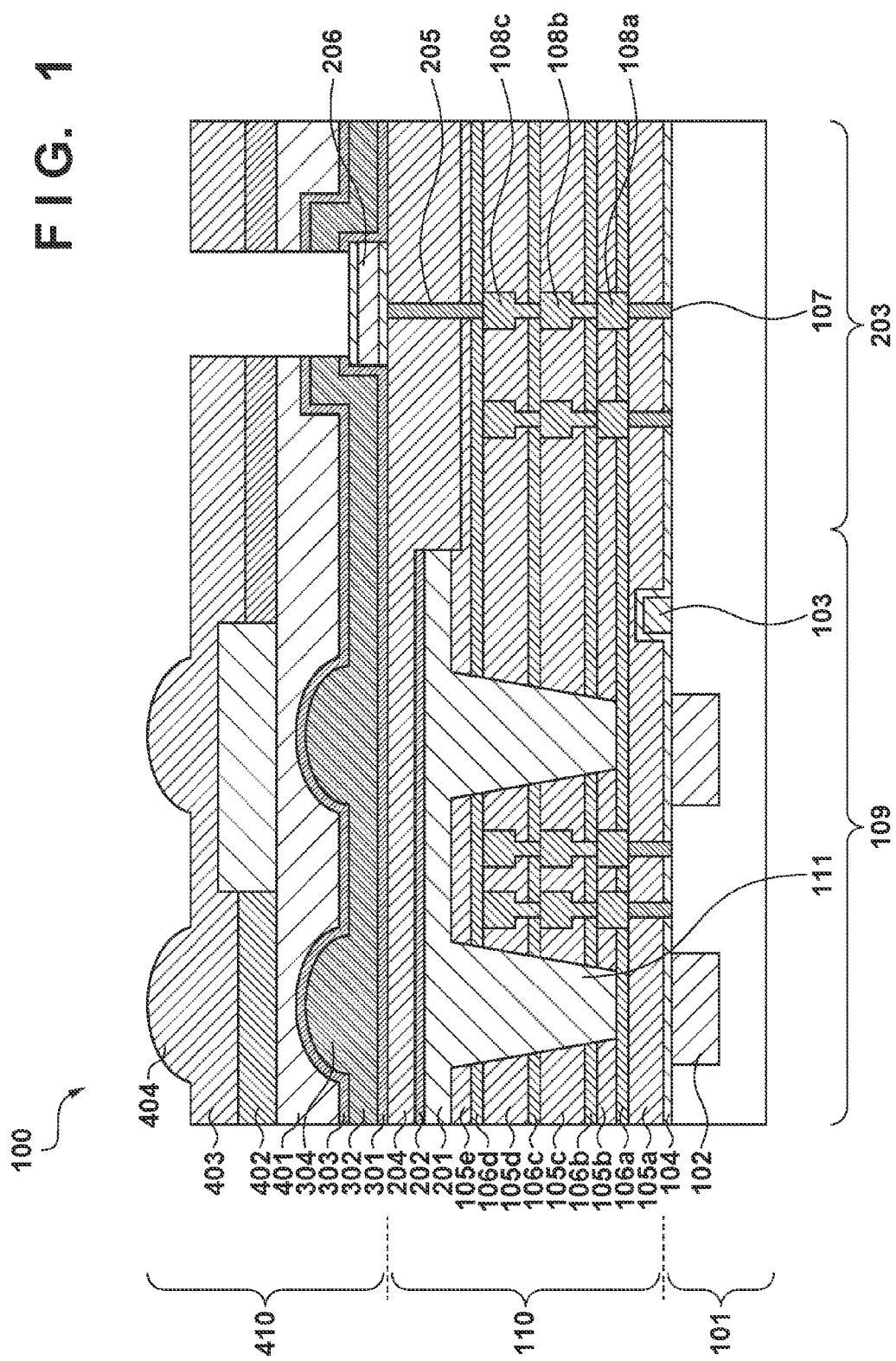
FIG. 1 is a view for explaining an example of the structure of a solid-state image sensor.

FIG. 1 is a schematic view showing an example of the structure of a solid-state image sensor (to be referred to as a "solid-state image sensor 100") according to the present invention. The solid-state image sensor 100 includes, for example, a semiconductor substrate 101 made of silicon or the like, a structure 110 which includes an insulating member and a metal member (an interconnection, a plug, or the like) formed in the insulating member, and a structure 410 which includes an optical element for condensing incident light. The solid-state image sensor 100 also includes an imaging region 109 in which a plurality of pixels are arrayed and a peripheral region 203 which surrounds the imaging region 109 and in which a circuit configured to process a pixel signal is arranged.

In the imaging region 109, photoelectric conversion portions 102 are formed in the substrate 101. A transistor configured to read out or process the pixel signal is also formed in the substrate 101. A gate electrode 103 of the transistor is illustrated in FIG. 1. The gate electrode 103 can be made of, for example, polysilicon.

An anti-reflection layer 104 is arranged so as to cover the substrate 101 and the gate electrode 103. The anti-reflection layer 104 prevents incident light which has passed through the optical element of the structure 410, and then reached the upper surface of the substrate 101 from being reflected by the upper surface. The anti-reflection layer 104 can be made of, for example, silicon nitride.

The insulating member of the structure 110 is generally formed by a plurality of insulating layers. In this example, the insulating member of the structure 110 includes, for example, insulating layers 105a to 105e and insulating layers 106a to 106d. For example, each of the insulating layers 105a to 105e is made of a material containing silicon oxide and has a thickness of about 120 nm to 1,000 nm. The material containing silicon oxide mainly contains silicon and oxygen, and is obtained by bonding this oxygen to silicon. The material containing silicon oxide may contain hydrogen, boron, carbon, nitrogen, fluorine, chlorine, phosphorus, and the like, in addition to silicon and oxygen. Each of the insulating layers 106a to 106d is made of a material containing silicon carbide and has a thickness of about 10 nm to 200 nm. The material containing silicon carbide mainly contains silicon and carbon, and is obtained by bonding this carbon to silicon. The material containing silicon carbide may contain hydrogen, boron, oxygen, nitrogen, fluorine, chlorine, phosphorus, and the like, in addition to silicon and carbon.

The metal member formed in the insulating member includes contact plugs 107 and interconnections 108a to 108c of the first to the third interconnection layers. Each contact plug 107 is made of, for example, tungsten and may also contain a barrier metal made of titanium, titanium nitride, or the like. The interconnections 108a to 108c are made of, for example, copper.

Note that the insulating layer 106a can act as an etching stopper in an etching step when manufacturing the solid-state image sensor 100, as will be described later. The insulating layers 106b, 106c, and 106d, respectively, can function as metal anti-diffusion layers for the interconnections 108a, 108b, and 108c.

Each light guide portion 111 having a core-clad structure is formed in the insulating member of the structure 110 in order to guide light which has passed through the optical element of the structure 410 to the photoelectric conversion portion 102. Each light guide portion 111 can be formed by forming an opening in the insulating layers 105a to 105e and 106a to 106d, and then filling this opening with a transparent material 201, details of which will be described later. The transparent material 201 forming the light guide portions 111 suffices to have a refractive index higher than the refractive index of silicon oxide of the insulating layers 105a to 105e and is made of, for example, silicon nitride or a resin. The material 201 forming the light guide portions 111 suffices to cause total reflection with respect to at least some insulating layers of the insulating member. Therefore, the material 201 may have the refractive index lower than the refractive index of silicon carbide of the insulating layers 106a to 106d thinner than the insulating layers 105a to 105e. It is not necessary that the transparent material 201 is the light-guide portions each having the core-clad structure. That is, the material 201 may have the refractive index equal to or lower than the refractive index of silicon oxide of the insulating layers 105a to 105e. For example, the material 201 may be made of the same silicon oxide as the insulating layers 105a to 105e.

An insulating layer 202 made of silicon oxynitride and an insulating layer 204 made of silicon oxide are further arranged on the material 201. The insulating layer 202 is arranged in the imaging region 109 and can function as an anti-reflection layer for the material 201 which forms the light guide portions 111. The insulating layer 204 can function as a planarized layer for further forming the structure 410 on the insulating layer 204 easily. A via plug 205 connected to the interconnection 108c is formed in the insulating layer 204. The via plug 205 is made of, for example, tungsten and may also contain the barrier metal made of titanium, titanium nitride, or the like.

An interconnection 206 is further arranged on the insulating layer 204 so as to connect to the via plug 205 formed in the insulating layer 204. The interconnection 206 is made of, for example, aluminium.

An insulating layer 302 which forms intralayer lenses 304, and an insulating layer 303 which is made of silicon oxynitride and covers the intralayer lenses 304 are further arranged on an insulating layer 301 made of silicon oxynitride on the insulating layer 204. Each intralayer lens 304 is positioned above the photoelectric conversion portion 102 and the light guide portion 111. Note that each of the insulating layer 301 and the insulating layer 303 can function as an anti-reflection layer for the insulating layer 302 which forms the intralayer lenses 304.

A planarized layer 401 made of a resin, a color filter layer 402 through which light having a predetermined wavelength passes, and a microlens layer 403 which forms microlenses 404 are further arranged on the insulating layer 303. Note that an opening is formed in the respective layers from the insulating layer 301 to the microlens layer 403 such that the interconnection 206 can be connected outside.

Respective steps in a method for manufacturing the solid-state image sensor 100 will be described below with reference to FIGS. 2A to 2E. The solid-state image sensor 100 can be manufactured by using a well-known semiconductor manufacturing process. However, steps which are not related to the present invention directly are omitted for clarity.

First, in the step of FIG. 2A, the substrate 101 in which the respective elements (the photoelectric conversion portion 102, an MOS transistor, and the like) are formed is prepared. Then, the anti-reflection layer 104 (silicon nitride), the insulating layers 105a to 105e (silicon oxide), the insulating layers 106a to 106d (silicon carbide), and the interconnections 108a to 108c are formed on the substrate 101.

The two types of insulating layers, namely, the insulating layers 105a to 105e and the insulating layers 106a to 106d are stacked alternately by the deposition method such as plasma CVD. In this example, each of the insulating layers 105a to 105e has the thickness of about 120 nm to 1,000 nm and each of the insulating layers 106a to 106d has the thickness of about 50 nm to 150 nm.

The interconnections 108a are formed between the insulating layer 106a and the insulating layer 106b. The interconnections 108b are formed between the insulating layer 106b and the insulating layer 106c. The interconnections 108c are formed between the insulating layer 106c and the insulating layer 106d. The insulating layers 106b, 106c, and 106d, respectively, can function as the metal anti-diffusion layers for the interconnections 108a, 108b, and 108c.

In the step of FIG. 2B, each part of the insulating member from the insulating layer 105b to the insulating layer 105e that has been formed in the step of FIG. 2A and is positioned above the photoelectric conversion portion 102 is removed by plasma etching, thereby forming openings OP. It is possible to suppress, by providing the openings OP, multiple reflection of light entering the photoelectric conversion portions 102 by the insulating layers 105a to 105e and the insulating layers 106a to 106d. In this step, the insulating layer 106a acts as the etching stopper.

In the step of FIG. 2C, each opening OP that has been formed in the step of FIG. 2B is filled with the transparent material 201, thereby forming the light guide portion 111. Each light guide portion 111 having the core-clad structure can be obtained by using, as the transparent material 201, a material larger than the insulating layers 105a to 105e in the refractive index. An example in which an inorganic material such as silicon nitride is used as the material 201 is shown here. However, an organic material may be used. The same silicon oxide as in the insulating layers 105a to 105e may be used as the transparent material 201 which fills the openings OP. The material 201 may be formed by high-density plasma CVD or another well-known CVD, or may be formed by a coating method or the like. The insulating layer 202 of silicon oxynitride is further formed on the material 201. The insulating layer 202 is formed by, for example, plasma CVD and has a thickness of about 50 nm to 150 nm.

Figure 2D:
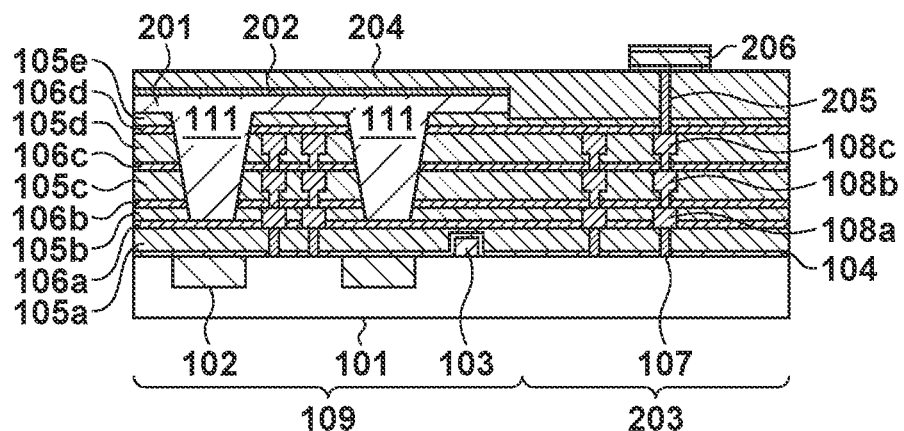

In the step of FIG. 2D, a portion in the peripheral region 203 of the material 201 and the insulating layer 202 is removed by etching or the like, and then the insulating layer 204 of silicon oxide is formed by, for example, plasma CVD. The upper surface of the insulating layer 204 may undergo a planarization process by CMP or the like. Then, the interconnection 206 made of aluminium is further formed on the insulating layer 204.

Figure 2E:
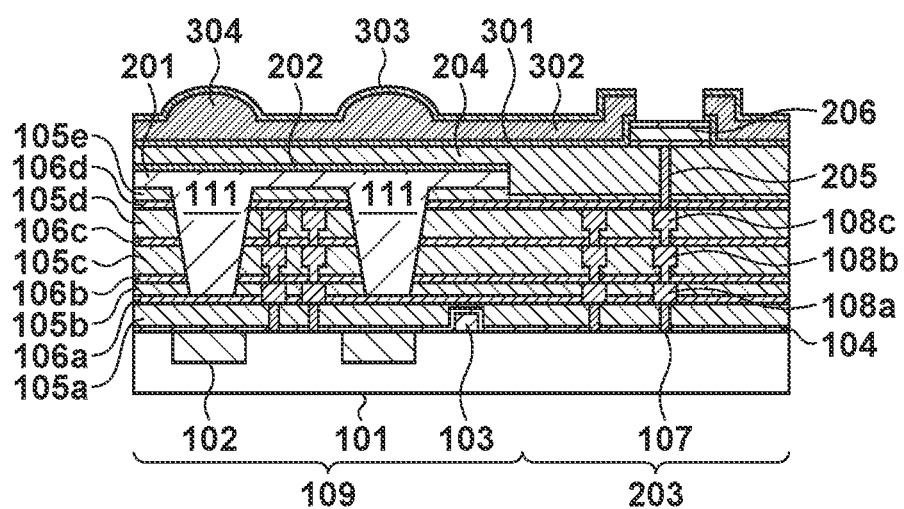

After that, the structure 410 including the optical element is formed on the insulating layer 204 and the interconnection 206 that have been formed in the step of FIG. 2D. FIG. 2E shows a state in which, out of the structure 410, the members from the insulating layer 301 to the insulating layer 303 which include the intralayer lens 304 are formed. The intralayer lens 304 is formed by, for example, forming the insulating layer 302 by plasma CVD or the like, and then processing the formed insulating layer 302 into a lens shape (such that the upper surface forms a spherical shape) by plasma etching or the like. Note that the structure 410 may further include another optical element.

When forming the structure 410, an annealing process may be performed at a temperature of 400° C. or more for 10 min or longer in some steps (for example, before forming the planarized layer 401 on the insulating layer 303). This annealing process can be performed, for example, in a gas atmosphere which contains at least one of hydrogen gas and nitrogen gas.

Then, the planarized layer 401, the color filter layer 402, and the microlens layer 403 are sequentially formed by using a well-known semiconductor process. The solid-state image sensor 100 is thus obtained.

In FIG. 2C, a step of forming the light guide portions 111 by filling the openings OP with the silicon nitride material 201 is typically performed by CVD or the like on a relatively high temperature condition. The linear expansion coefficient of silicon oxide is 0.70 [ppm/K] while the linear expansion coefficient of silicon carbide is 4.00 [ppm/K]. A difference in a thermal expansion coefficient is large between them. Consequently, a stress may be caused by a temperature change between the insulating layers 105a to 105e of silicon oxide and the insulating layers 106a to 106d of silicon carbide, and they may be separated from each other. This particularly tends to occur between the insulating layer 106d which is the uppermost layer out of the insulating layers 106a to 106d of silicon carbide and the insulating layer 105d or 105e adjacent to it.

To prevent this, the step of forming the light guide portions 111 in FIG. 2C is performed at a temperature lower than a temperature in a step of forming the insulating layer 106d in FIG. 2A. More specifically, the difference in the temperature between the step of forming the light guide portions 111 and the step of forming the insulating layer 106d is 10° C. or more, and preferably 50° C. or more. For example, when the temperature in the step of forming the insulating layer 106d is set to 400° C., the temperature in the step of forming the light guide portions 111 is set to 350° C. For example, when the temperature in the step of forming the insulating layer 106d falls within the range of 390° C. to 410° C., the temperature in the step of forming the light guide portions 111 may fall within the range of 340° C. to 360° C.

Note that an experiment was performed by setting the temperature in the step of forming the insulating layer 106d to 400° C. and changing the temperature in the step of forming the light guide portions 111. When the temperature in the step of forming the light guide portions 111 was set to 446° C., separation of the insulating layer 106d was seen in many portions. When the above-described temperature was set to 400° C., separation of the insulating layer 106d was still seen though the separated portions were decreased as compared with a case in which the temperature was 446° C. On the other hand, when the above-described temperature was set to 350° C., no separation of the insulating layer 106d was seen.

As described above, in or after the step of FIG. 2E, the annealing process may be performed at the temperature of 400° C. or more for 10 min or longer in the hydrogen gas atmosphere or the nitrogen gas atmosphere in some steps. This is because the openings OP are filled with the material 201 and the plurality of layers (for example, the insulating layers 202 and 204) are further formed on the openings OP, reducing and relaxing the stress that can be caused between the above-described two types of insulating layers. In the example of the manufacturing method above, a mode in which the annealing process is performed after FIG. 2E and before forming the planarized layer 401 on the insulating layer 303 has been exemplified. However, the timing of the annealing process can be at any time after the openings OP are filled with the material 201.

According to the method for manufacturing the solid-state image sensor 100 above, it is possible to prevent separation between the insulating layers 105a to 105e of silicon oxide and the insulating layers 106a to 106d of silicon carbide when forming the light guide portions 111, and to improve quality of the solid-state image sensor 100.

The temperature in each step described above (more specifically, the temperature in each of the steps of forming the insulating layer 106d and the light guide portions 111) is measured in accordance with a well-known temperature measurement method. However, the temperature of the substrate 101 may be measured. A noncontact thermometer (pyrometer) can be used for temperature measurement.

In order to maintain the temperature in each step constant, cooling helium gas may be supplied from the lower side of the substrate 101 at a constant pressure or the pressure of the helium gas may be controlled based on the measured temperatures.

A method for adjusting the temperature in each step will be described below. The temperature in each step indicates a temperature when the substrate 101 is processed in that step. It is preferable, however, that the temperature is considered in a period during which the substrate 101 is placed in the chamber of a processing apparatus, and then removed from the chamber. That is, it is preferable that the temperature of the substrate 101 is managed not only in a period during which a target process is actually performed (more specifically, CVD for forming the insulating layer 106d or the light guide portions 111; ditto for the following) but also in a step accompanying with the period. This example will be described below with reference to FIGS. 3A to 3C.

Figure 3A:
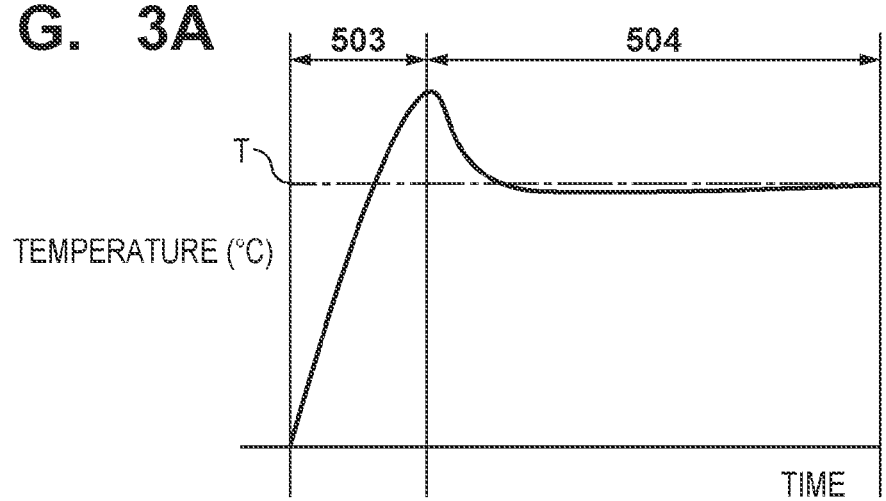
FIGS. 3A to 3C are graphs for explaining an example of a method for controlling a temperature when forming a light-guide portion.
Figure 3B:
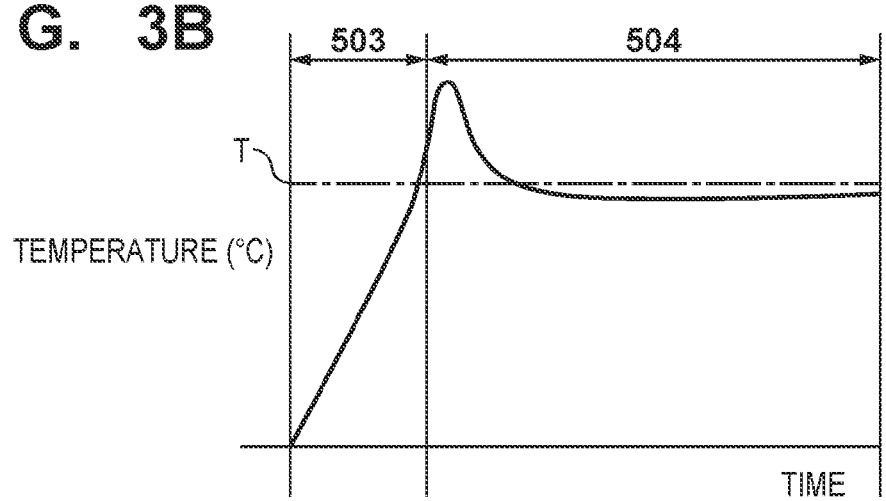
Figure 3C:
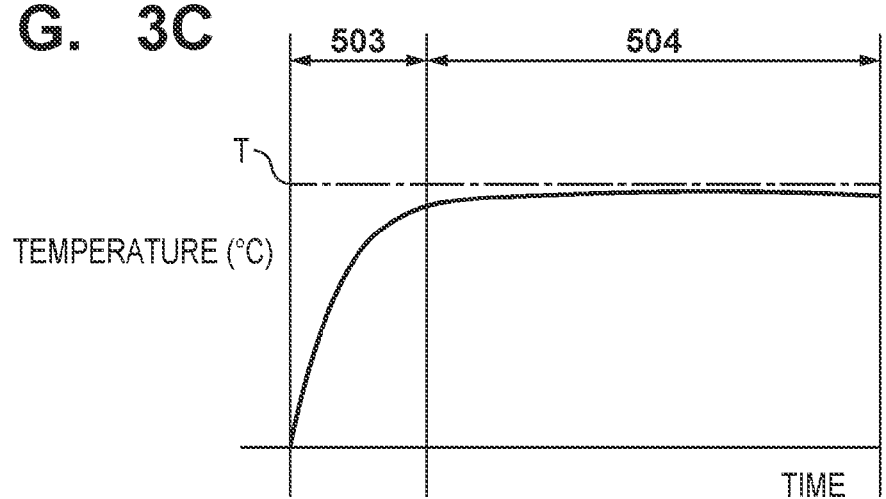

FIGS. 3A to 3C are graphs each showing the temperature of the substrate 101 measured in a period during which the substrate 101 is placed in the chamber of the processing apparatus, and then a process for the substrate 101 is terminated. In each of FIGS. 3A to 3C, in a period 503, the substrate 101 is heated so as to reach a target temperature T before the process for the substrate 101 is started. In a subsequent period 504, the target process is performed on the substrate 101 when the temperature substantially reaches the temperature T.

As the first method for above-described heating, FIG. 3A shows the graph when the period 503 is a preset period and the target process is started after the substrate 101 is heated for the preset period. If the period 503 is set such that the temperature of the substrate 101 reaches the temperature T, the temperature of the substrate 101 becomes still higher than the temperature T when performing the target process. This may cause separation of the insulating layer 106d described above.

As the second method for the above-described heating, FIG. 3B shows the graph when the substrate 101 is heated while measuring its temperature in the period 503, and heating is stopped and the target process is started in response to the fact that the measured temperature of the substrate 101 has reached the temperature T. According to this method, for example, the temperature of the substrate 101 becomes still higher than the temperature T instantaneously by a bias power applied to the processing apparatus when the target process is started. This may cause separation of the insulating layer 106d described above.

It is therefore necessary to set the heating period 503 and the target temperature T such that the temperature of the substrate 101 does not exceed a desired temperature over a period during which the substrate 101 is placed in the chamber of the processing apparatus, and then the process for the substrate 101 is terminated. For example, the period 503 needs to be set shorter in the example of FIG. 3A and the temperature T needs to be set lower in the example of FIG. 3B.

FIG. 3C shows an example in which the temperature of the substrate 101 does not exceed a set value in a time between placing the substrate 101 in the chamber of the processing apparatus and terminating the process for the substrate 101. It is possible to prevent separation of the insulating layer 106d described above and to improve quality of the solid-state image sensor 100 by adjusting the temperature of the substrate 101 appropriately not only in a period during which the target process is actually performed but also in the step accompanying with the period.

A preferred embodiment of the present invention has been exemplified above. However, the present invention is not limited to the above-described example as a matter of course, and may partially be changed without departing from the spirit and scope of the invention.

Figure 4:
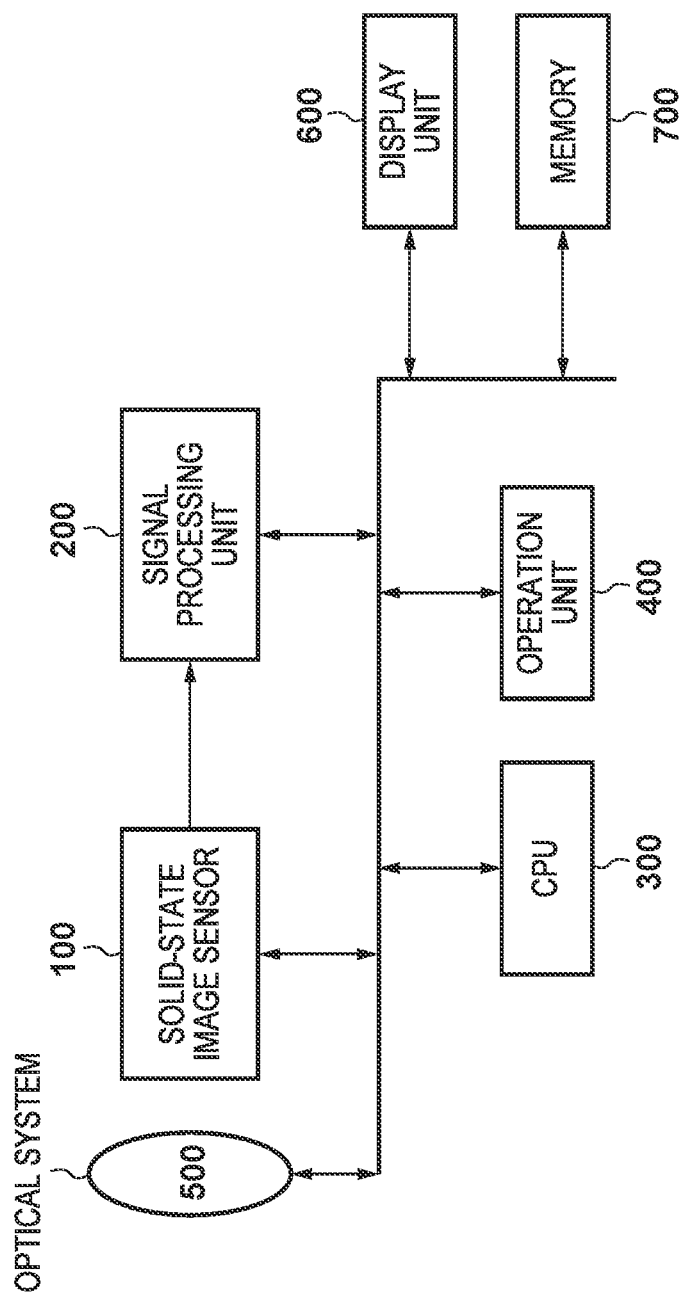
FIG. 4 is a block diagram for explaining an example of the arrangement of a camera.

FIG. 4 is a block diagram for explaining an example of the arrangement of a camera to which the solid-state image sensor 100 shown in the above example is applied. The camera includes, for example, a processing unit 200, a CPU 300 (or a processor), an operation unit 400, and an optical system 500, in addition to the solid-state image sensor 100. The camera can further include a display unit 600 configured to display a still image and a moving image to a user, and a memory 700 configured to store their data. The solid-state image sensor 100 generates image data based on light that has passed through the optical system 500. The image data undergoes predetermined correction processing by the processing unit 200, and output to the display unit 600 and the memory 700. The CPU 300 can change setting information or a control method of each unit in accordance with a shooting condition input by the user via the operation unit 400. Note that the concept of the camera includes not only an apparatus mainly aiming at shooting but also an apparatus (for example, a personal computer or a portable terminal) accessorily having a shooting function.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-051293, filed Mar. 13, 2015, which is hereby incorporated by reference herein in its entirety.

What is claimed is:

1. A method for manufacturing a solid-state image sensor, the method comprising:
   preparing a semiconductor substrate including a photoelectric conversion portion;
   forming, on the semiconductor substrate, a structure comprising a first member, which has an insulating property, containing silicon oxide, and a second member, which has an insulating property, arranged on the first member and containing silicon carbide;
   forming an opening in a position over the photoelectric conversion portion in the structure by removing a part of the first member and a part of the second member;
   forming a third member, which has a transparent property, in the opening; and
   performing an annealing process after the forming of the third member,
   wherein the second member is formed at a first temperature in the forming the structure, and
   wherein the third member is formed at a second temperature lower than the first temperature.

2. The method according to claim 1, wherein the second member is formed by plasma CVD in the forming of the structure, and
   wherein the third member is formed by plasma CVD.

3. The method according to claim 1, wherein a difference between the first temperature and the second temperature is not less than 10° C.

4. The method according to claim 1, wherein the first temperature is 390° C. to 410° C., and
   wherein the second temperature is 340° C. to 360° C.

5. The method according to claim 1, wherein the annealing process is performed at a temperature higher than the first temperature.

6. The method according to claim 5, wherein the annealing process is performed in a gas atmosphere which contains at least one of hydrogen gas and nitrogen gas.

7. The method according to claim 5, further comprising forming an intralayer lens between the forming of the third member and the performing of the annealing process.

8. The method according to claim 1, wherein the structure further includes an interconnection containing a metal,
   wherein the second member acts as an anti-diffusion layer for the metal, and
   wherein the third member acts as a light-guide portion.

9. The method according to claim 1, wherein the structure comprises a plurality of layers where layers of a material containing silicon oxide and layers containing silicon carbide are formed alternately, and
   wherein the second member is an uppermost layer out of the layers of the material containing the silicon carbide in the plurality of layers.

10. The method according to claim 1, wherein a temperature is adjusted by using helium gas in the forming of the third member.

* * * * *